July 6, 1971 NOBUO KAWAMURA ET AL 3,591,423

METHOD OF MANUFACTURING SEMICONDUCTOR ELEMENTS
AND SEMICONDUCTOR INTEGRATED CIRCUITS
Filed March 11, 1968

INVENTORS
NOBUO KAWAMURA
KAZUO KAMIMURA

BY
Hopgood & Calimafde
ATTORNEYS 3,591,423

METHOD OF MANUFACTURING SEMICONDUCTOR ELEMENTS AND SEMICONDUCTOR INTEGRATED CIRCUITS

Nobuo Kawamura and Kazuo Kamimura, Tokyo, Japan, assignors to Nippon Electric Company, Limited, Tokyo, Japan Filed Mar. 11, 1968, Ser. No. 712,212
Claims priority, application Japan, Mar. 20, 1967, 42/17,298
Int. Cl. H01l 7/06, 7/34
U.S. Cl. 148—1.5 3 Claims

ABSTRACT OF THE DISCLOSURE

A method is provided for manufacturing semiconductor elements and semiconductor integrated circuits of the silicon type having a silicon dioxide film wherein a stable silicon-silicon dioxide system is produced having a low surface charge density which does not alter during bias-temperature treatment, the method comprising annealing the element at a temperature of at least about 850° C. in an atmosphere of hydrogen.

This invention relates to a method for producing a stable silicon semiconductor element or semiconductor integrated circuit having a silicon dioxide film characterized by low surface charge density.

Planar type silicon elements and insulator gate type (hereafter called MOS type) semiconductor elements or semiconductor integrated circuits are known in which the silicon oxide ($SiO_2$) films are manufactured either by thermal oxidation of silicon surface in an oxidizing atmosphere or by thermal decomposition of a silicon compound. In the case of elements involving the silicon-silicon oxide system (hereafter called Si—$SiO_2$ system) produced by the foregoing methods, negative charges (hereafter called surface charge) are accumulated in the silicon surface such that the surface tends to be of an n-type. However, it is well known that in such systems, the surface charge density is altered upon application of an electric field across the $SiO_2$ film at a heating temperature of 100° C.–300° C. (hereafter called bias-temperature treatment).

In an effort to improve the characteristics of and to further stabilize planar type silicon elements, including the MOS type semiconductor element or semiconductor integrated circuit, attempts have been made in the past to maintain the surface charge density as low as possible while at the same time produce a stable Si—$SiO_2$ system whose surface charge density is not altered during the bias-temperature treatment. However, these attempts have much to be desired.

It is thus the object of the present invention to provide a method of manufacturing stable silicon semiconductor elements or semiconductor integrated circuits comprising the Si—$SiO_2$ system in which the surface charge is not altered to any appreciable degree by the bias-temperature treatment involving the application of either positive or negative voltage.

Another object of the present invention is to provide a silicon semiconductor element or circuit characterized in that the Si—$SiO_2$ system is stabilized by an annealing treatment at a temperature of 850° C. or higher in hydrogen atmosphere.

Figure 1:
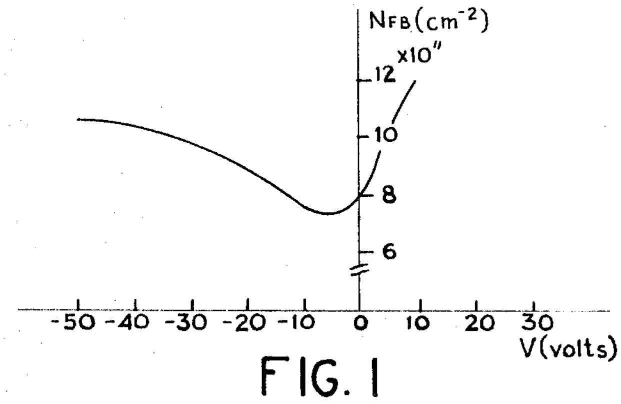

These and other objects will more clearly appear from the following description and the accompanying drawing, wherein:

FIG. 1 shows a typical example of variation in silicon surface charge density of conventional MOS diodes as a result of conventional annealing under impressed voltage (hereafter called bias-temperature treatment).

Figure 2:
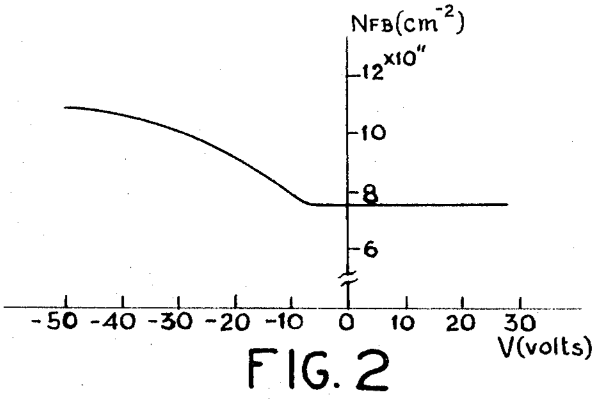
Figure 3:
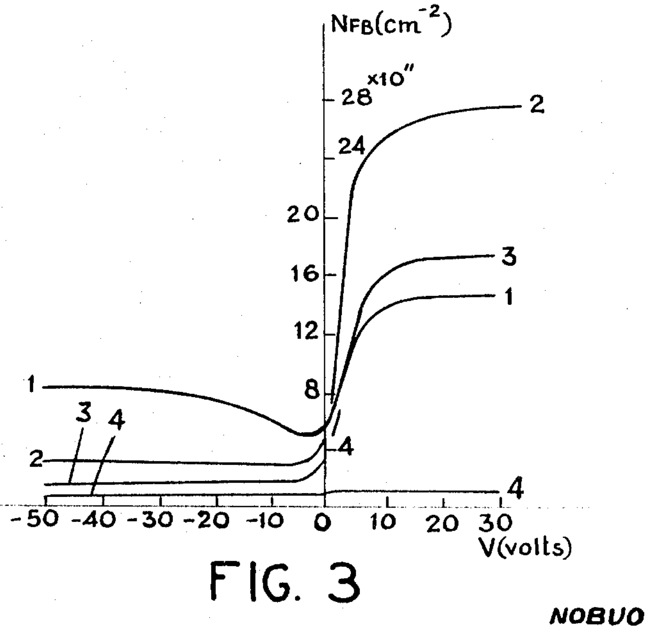

FIG. 2 is an example showing the effect of bias-temperature treatment on the variation in surface charge density of MOS diodes manufactured by thermal oxidation method in a dry oxygen atmosphere, the material being free from sodium contamination; and FIG. 3 shows the effect of the bias-temperature treatment on the surface charge density of MOS diodes manufactured from the clean silicon-silicon oxide systems formed by the thermal oxidation of the silicon surfaces in a dry oxygen atmosphere followed by annealing at various temperatures in a hydrogen atmosphere.

The present invention is an improvement in that it provides a manufacturing method for producing semiconductor elements or semiconductor integrated circuits comprising a Si—$SiO_2$ system having extremely low aforementioned surface charge density, while at the same time being stable against the bias-temperature treatment.

Surface charge density of the Si—$SiO_2$ stystem of a silicon semiconductor can be determined from the capacitance-voltage characteristics of MOS diode and, as is known, the stability against the bias-temperature treatment may be evaluated by the magnitude of the shift on the voltage axis of the capacitance-voltage characteristic caused by the bias-temperature treatment.

FIG. 1 is one example showing the variation of the surface charge density $N_{FB}$ of a representative known MOS diode when various voltages V (hereafter the voltage will be called positive when positive voltage is applied to the metal gate electrode and negative when negative voltage is applied) are applied across the two terminals of MOS diode and heated to 250° C. It has been known that the enhancement of the surface charge observed in the bias-temperature treatment in which a positive voltage is applied to the metal gate electrode of a MOS diode and the reduction of the surface charge in the bias-temperature treatment in which a negative voltage is applied are caused by movement of sodium ions within the $SiO_2$ film introduced into the $SiO_2$ film during the manufacturing procedure of the film. Actually, in the case of a clean MOS diode manufactured with extreme care to eliminate contamination by sodium ions, no such variation of surface charge is observed as shown by FIG. 2. The enhancement of surface charge observed in the bias-temperature treatment by large negative voltage application is independent of the presence or absence of sodium ions, and is believed due to the generation of structural defects in the Si—$SiO_2$ system at the boundary surface of Si—$SiO_2$. At any rate, at present it is still not understood, and an adequate stabilization method has not been available.

FIG. 3 is illustrative of the markedly improved results obtained by the present invention. The curves 1, 2, 3 (outside the invention) and 4 (the invention) indicate the alterations of surface charge density at 250° C. bias-temperature treatment of the MOS diode manufactured by further processing a clean semiconductor comprising the Si—$SiO_2$ system made by thermally oxidizing at 1150° C. in dry oxygen. Following the oxidizing, the diodes were subjected to one hour annealing at temperatures of 400°, 600°, 800° and 1000° C., respectively, in hydrogen atmosphere, the gate electrode being provided by means of evaporation of metal on $SiO_2$. It will be noted that when the diodes were annealed in hydrogen atmosphere at a temperature below 800° C. the surface charge was found to be excessively altered. It was observed that when annealed at a temperature of 850° C. or higher, the alteration was found to be markedly inhibited. In particular, when annealed at a temperature of 1000° C. or higher the surface charge alteration was found to be very low as shown by curve 4 of FIG. 3. A still further important characteristic of the present invention is by processing the Si—$SiO_2$ system in accordance with the invention, the surface charge density itself is very small as shown by curve 4.

It has been confirmed that approximately ten minutes is sufficient for obtaining the intended result in annealing of the Si—$SiO_2$ system. Longer time period than 10 minutes only improves the result slightly.

The foregoing demonstrates the effectiveness of high temperature annealing of a semiconductor comprising the Si—$SiO_2$ system made by the thermal oxidation method. In addition, experiments have confirmed that the method is equally effective on the Si—$SiO_2$ system produced by the thermal decomposition of silicon compounds.

In summary, it is apparent from the foregoing that the invention enables the production of a stable Si—$SiO_2$ system with a low surface charge density which does not alter during the bias-temperature treatment, and also enables the manufacture of stable semiconductor elements and semiconductor integrated circuits possessing markedly improved characteristics.

Stating it broadly, the method comprises taking a silicon semiconductor element or integrated circuit and forming a silicon dioxide film thereon. Following the formation of the film, the semiconductor is subjected to annealing in hydrogen for a time period of at least ten minutes at a temperature of at least about 850° C. and, more advantageously at a temperature of at least about 1000° C. Tests have indicated that a temperature of approximately 1000° C. gives markedly improved results.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claims.

What is claimed is:

1. In a method of manufacturing silicon seemiconductor elements and semiconductor integrated circuits wherein a silicon dioxide film is formed on the surface of the silicon, the improvement of providing a stable silicon-silicon dioxide system characterized by low surface charge density which does not substantially alter during bias-temperature treatment which comprises subjecting the semiconductor with the silicon dioxide film formed thereon to annealing in hydrogen at a temperature of at least about 850° C. for at least about 10 minutes.

2. The method of claim 1, wherein the annealing temperature is at least about 1000° C.

3. The method of claim 2, wherein the annealing temperature is approximately 1000° C.

References Cited

UNITED STATES PATENTS

| | | | |
|---|---|---|---|
| 3,349,474 | 10/1967 | Rauscher ____________ | 148—187 |
| 3,411,199 | 11/1968 | Heiman et al. _______ | 148—187 |

L. DEWAYNE RUTLEDGE, Primary Examiner

R. A. LESTER, Assistant Examiner

U.S. Cl. X.R.

117—201; 148—13, 187, 188